(12) United States Patent
Cairns et al.

(10) Patent No.: US 6,806,734 B2
(45) Date of Patent: Oct. 19, 2004

(54) LEVEL SHIFTING CIRCUIT AND ACTIVE MATRIX DRIVER

(75) Inventors: Graham Andrew Cairns, Oxford (GB); Christopher James Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 20 days.

(21) Appl. No.: 10/379,402

(22) Filed: Mar. 4, 2003

(65) Prior Publication Data
US 2003/0173995 A1 Sep. 18, 2003

(30) Foreign Application Priority Data
Mar. 14, 2002 (GB) .............................................. 0205948

(51) Int. Cl.[7] ............................................. H03K 19/094
(52) U.S. Cl. ............................. 326/68; 326/81; 327/333
(58) Field of Search ............................... 326/68, 62, 63, 326/80, 81; 327/333

(56) References Cited

U.S. PATENT DOCUMENTS

| | | | |
|---|---|---|---|
| 5,729,154 A | * | 3/1998 | Taguchi et al. ................ 326/30 |
| 5,828,231 A | * | 10/1998 | Bazargan ....................... 326/81 |
| 6,087,881 A | * | 7/2000 | Chan et al. .................. 327/333 |
| 6,268,755 B1 | * | 7/2001 | Summerlin et al. ......... 327/333 |
| 6,476,637 B1 | * | 11/2002 | Brownlow et al. ............ 326/81 |

* cited by examiner

Primary Examiner—James H. Cho
(74) Attorney, Agent, or Firm—Renner, Otto, Boisselle & Sklar, LLP

(57) ABSTRACT

A level shifting circuit comprises a first low power, low speed level shifter 30 and a second high power, high speed level shifter stage 31. Both the stages 30, 31 have signal inputs connected to a common input IN for receiving signals, at least one of whose levels is to be shifted. The output of the first stage 30 is connected to an enable input EN2 of the second stage 31 and switches the operation of the second stage 31 between an enabled state and a disabled state in which the second stage 31 consumes little or no power. The first stage 30 has an enable input EN1 which may be permanently enabled.

28 Claims, 22 Drawing Sheets

LEVEL SHIFTING CIRCUIT AND ACTIVE MATRIX DRIVER

BACKGROUND OF THE INVENTION

1. Field of the Invention

The present invention relates to a level shifting circuit and to an active matrix driver including such a circuit.

2. Description of the Related Art

Level shifting circuits are required, for example, in digital metal oxide semiconductor (MOS) circuits which are required to respond to input signals of substantially lower amplitude than the supply voltage. Such circuits are used in silicon-on-insulator (SOI) circuits which are required to interface with low voltage signals, for example having amplitudes typically in the region of from 1 to 5 volts, but which typically operate at substantially higher supply voltages, for example in the region of between 10 and 20 volts. A specific example of such an arrangement is a monolithic driver circuit for a flat panel active matrix display fabricated with poly-silicon thin-film transistors (TFTs). Another application of level shifting circuits is in interfaces between different logic families, for example TTL and CMOS.

FIG. 1 of the accompanying drawings illustrates a known type of level shifting circuit comprising n-channel transistors 1 and 2 whose sources are connected to ground and whose drains are connected to the drains of p-channel transistors 3 and 4, respectively. The sources of the transistors 3 and 4 are connected to the drains of p-channel transistors 5 and 6, respectively, whose sources are connected to a power supply line vdd. The drains of the transistors 1 and 3 are connected to the gate of the transistor 6 and to a complementary output !OUT whereas the drains of the transistors 2 and 4 are connected to the gate of the transistor 5 and to an output OUT. The gates of the transistors 1 and 3 are connected to an input IN whereas the gates of the transistors 2 and 4 are connected to a complementary input !IN.

Although such an arrangement is capable of providing level shifting of a digital input signal such that the output voltage swing is greater than the input voltage swing, this arrangement is not tolerant of transistors with threshold voltages which are of a similar level to the input signal. For example, poly-silicon transistors may have a threshold in the region of 3 volts and so such a circuit can only operate with input signals having a higher level substantially greater than this with respect to ground.

FIG. 2 of the accompanying drawings illustrates another known level shifting circuit which is more tolerant of high transistor threshold voltages. This type of arrangement is known as a differential current mirror sense amplifier and is disclosed, for example, in N.West and K.Eshragian, "Principal of CMOS Design", Addison Wesly, 1993. The circuit comprises a differential pair of n-channel transistors 7 and 8 whose gates are connected to complementary input terminals INB and IN, respectively, and whose sources are connected to a tail current source comprising an n-channel transistor 9 whose gate is connected to a bias voltage source Vbias and whose source is connected to a power supply line vss. The drains of the transistors 7 and 8 are connected to a current mirror formed by p-channel transistors 10 and 11 connected to a further supply line vddd and the drain of the transistor 7 forms the output OUT of the circuit. However, this type of circuit is unable to provide a high degree of level shifting, especially for a digital logic signal where one logic level remains unshifted.

U.S. Pat. No. 5,729,154 discloses another known type of level shifter which is more suitable for poly-silicon integration technology and which is illustrated in FIG. 3 of the accompanying drawings. The circuit comprises an n-channel transistor 12 whose source is connected to an input IN and whose drain is connected to the drain of a p-channel transistor 13, whose source is connected to a supply line vddd. Another n-channel transistor 14 has a source connected to a supply line vss and a gate and drain connected together and to the gate of the transistor 12 and to the drain of a p-channel transistor 15, whose source is connected to the supply line vddd. The gates of the transistor 13 and 15 are connected to the supply line vss. The drains of the transistors 12 and 13 are connected to a conventional complementary transistor inverter comprising transistors 16 and 17 and whose output forms the output OUT of the level shifting circuit.

A disadvantage of this arrangement is that it has a relatively high current consumption. In particular, the transistors 14 and 15 form a path between the supply lines vddd and vss which conducts current continuously. Also, when the input signal to the source of the transistor 12 is a logic low level signal, there is a further path through the transistors 12 and 13 between the supply lines. In order to avoid phase delays between the input and the output signals of the level shifting circuit, the circuit must operate at high speed. This requires relatively large currents and results in a relatively large power consumption.

GB 2 360 405 discloses level shifting circuits which are capable of operating at high speed and with relatively low power consumption. FIG. 4 of the accompanying drawings illustrates one example of such a circuit which comprises an n-channel transistor 18 and a p-channel transistor 19. The source and gate of the transistor 18 are connected to a signal input IN and an enable input EN, respectively, whereas the drain of the transistor 18 is connected to an output terminal OUT. The transistor 19 has a gate connected to a supply line vss, a source connected to another supply line vddd and a drain connected to the output terminal OUT.

When the enable signal at the enable input EN is active, the gate of the transistor 18 is biased to a voltage higher than its threshold voltage relative to the supply line vss. The transistor 19 is biased so as to be on but is more "weakly" conductive than the transistor 18. When the input signal at the input IN is at a low level (at or near the potential of the supply line vss), the transistor 18 is turned on and conducts more strongly than the transistor 19 so that the output is pulled to a low level. Conversely, when the input signal is at a higher level, the transistor 18 is turned off and the output OUT is pulled towards the voltage of the supply line vddd by the transistor 19. When the circuit is disabled, the transistor 18 is turned off and the output OUT is pulled towards the voltage of the supply line vddd by the transistor 19.

FIG. 5 of the accompanying drawings illustrates a modified form of the level shifting circuit shown in FIG. 4 in which the enable input EN is also connected to the input of an inverter 20 whose output is connected to the gate of the transistor 19 and to a pull-down transistor 21. In this case, when the circuit is disabled, the transistor 19 is switched off and the pull-down transistor 21 pulls the output OUT towards the voltage of the supply line vss.

FIG. 6 of the accompanying drawings shows another form of the level shifting circuit of GB 2 360 405. The gate of the transistor 18 is connected to the gate and drain of an n-channel transistor 22 whose source is connected to the supply line vss. The source and drain of the transistor 22 are connected to the drain of a p-channel transistor 23 whose source is connected to the supply line vdd and whose gate is connected to the gate of the transistor 19 and to the enable input EN. The enable input EN is connected to the gate of the pull-down transistor 21 and to the gate of another pull-down transistor 24 connected across the transistor 22.

This arrangement provides more accurate biasing of the "pass gate" transistor 18 and provides a higher degree of level shifting. When the circuit is enabled, the transistors 22 and 23 bias the gate of the transistor 18 just above its threshold voltage. When the circuit is disabled, the pull-down transistor 24 is turned on and the gates of the transistors 18 and 22 are pulled towards the voltage of the supply line vss so that the transistors are switched off.

There are many applications in which the input signals whose voltage levels are to be shifted have a relatively small mark:space ratio (MSR) and the synchronisation requirements are such that only one edge of the input signal needs to have its timing maintained accurately. For example, one such application is in active matrix display in which such circuits are used to shift the levels of vertical and horizontal synchronisation signals as illustrated in FIG. 7. Although the level shifting circuits disclosed in GB 2 360 405 provide good performance, they may not provide an optimum solution because it is necessary for such circuits to be permanently enabled in order to respond to the incoming synchronisation pulses.

U.S. Pat. No. 6,268,755 discloses a MOSFET predrive circuit with independent control of the output voltage rise and fall times. This circuit comprises a first voltage level shifting circuit for converting an input signal having a first voltage swing to an output voltage having a second voltage swing and a second stage for controlling the rise and fall times of the output signal.

U.S. Pat. No. 6,087,881 discloses an integrated circuit level shifting predrive circuit having two level shifting stages which are connected in series. This level shifting circuit uses three bias supply circuits, each providing a different DC bias voltage. A first stage shifts the input signal voltage from the lowest bias voltage to the intermediate bias voltage. A second stage shifts the signal voltage from the intermediate bias voltage to the highest bias voltage. This arrangement distributes the voltage swing among the devices such that the stress across the dielectric layer of any single device is reduced.

With the above-described conventional structure, in order to avoid phase delays between the input and the output signals of the level shifting circuit, the circuit must operate at high speed. This requires relatively large currents and results in a relatively large power consumption.

The present invention has an objective of providing a level shifting circuit which solves the above-described problems, and is capable of operation at high speed and is of relatively low power consumption as compared with the above-described conventional art, and an active matrix driver using the same.

SUMMARY OF THE INVENTION

According to a first aspect of the invention, there is provided a level shifting circuit comprising: a first level shifting stage having a first enable input, a first signal input for receiving an input signal having a first voltage swing, a first output for providing a first output signal having a second voltage swing greater than the first voltage swing, a first power consumption when enabled, and a first switching speed; and a second level switching stage having a second enable input connected to the first output, a second signal input for receiving the input signal, a second output for providing a second output signal having a third voltage swing greater than the first voltage swing, a second power consumption when enabled and a third power consumption when disabled with the second power consumption being greater than each of the first and third power consumptions, and a second switching speed which is faster than the first switching speed.

The term "voltage swing" as used herein means the difference between the maximum and minimum voltages of a signal. The term "switching speed" as used herein refers to the reciprocal of the time taken for a signal to switch between its extreme values within predetermined tolerances.

The input signal may swing between first and second voltage levels and the first and second stages may be arranged to shift only the second voltage level. The first voltage level may be ground potential.

The third power consumption may be substantially equal to zero.

The second stage may comprise setting means for setting the second output to a predetermined state (for example high level, low level or high impedance) when the second stage is disabled. The setting means may comprise a pull-up or pull-down transistor whose control electrode is connected to the second enable input.

The first enable input may be connected for permanently enabling the first stage.

The first and second signal inputs may be differential inputs.

The circuit may comprise a sequential logic circuit having a synchronisation input connected to the second output and a clock input for receiving a clock signal. The logic circuit may be arranged to produce output pulses synchronised to the second output signal and to the clock signal. Each output pulse may have a pulse width substantially equal to the pulse width or period of the clock signal.

The logic circuit may comprise a D-type latch having a data input connected to the second output and a clock input connected to receive the clock signals. The logic circuit may comprise an AND gate having a first input connected to the second output and a second input connected to an inverting output of the latch.

The circuit may comprise a third level shifting stage having a third output connected to the clock input of the logic circuit, a third signal input for receiving the clock signal, and a third enable input responsive to the second output signal. The third enable input may be connected to the second output.

As an alternative, the third enable input may be arranged to receive the result of ANDing the second output signal with the complement of the output signal of the logic circuit.

Each of the first and second stages and the third stage when present may comprise a sub-stage comprising a first transistor of a first conductivity type whose common terminal is connected to the signal input of the stage and whose output terminal is connected to the output terminal of a second transistor of a second conductivity type opposite the first type, whose common terminal is connected to a first power supply line. The output terminal of the first transistor may be connected via at least one inverter to the output of the stage. The control terminal of the first transistor may be connected to the enable input of the stage. The control terminal of the second transistor may be connected to a second power supply line.

The sub-stage may comprise a third transistor of the first conductivity type, whose control and output terminals are connected to the output terminal of the first transistor, and a fourth transistor of the second conductivity type, whose common terminal is connected to the first power supply line, whose output terminal is connected to the output terminal of the third transistor, and whose control terminal is connected to the control terminal of the second transistor and to the enable input of the stage. The common terminal of the third transistor may be connected to a second power supply line. In the case of complementary signal inputs, the common terminal of the third transistor may be connected to a complementary signal input of the stage.

The sub-stage of each of the second stage and, when present, the third stage may comprise a pull-down transistor connected between the output terminal of the first transistor and a or the second power supply line with a control terminal connected to the second or third enable input.

The terminology used herein to refer generically to the terminals of a transistor is such that the common terminal and the output terminal are connected to the main conduction path through the transistor and the voltage between the control and common terminals or the current flowing between the control and common terminals controls the conduction of the main conduction path between the common and output terminals. In the case of field effect transistors, the common terminal is the source terminal, the output terminal is the drain terminal, and the control terminal is the gate terminal.

The or each transistor may be a metal oxide semiconductor (MOS) transistor, for example a poly-silicon thin film transistor.

According to a second aspect of the invention, there is provided an active matrix driver comprising a circuit according to the first aspect of the invention.

It is thus possible to provide a level shifting circuit which is capable of operation at high speed and is of relatively low power consumption. Such an arrangement is particularly suitable for level-shifting signals of small mark: space ratio because the second stage is enabled with a relatively low duty cycle. The relatively high power consumption of the second stage only occurs when necessary and the first stage is not required to operate at such high speed and can therefore have a much lower power consumption. This arrangement is particularly suitable where the input signals are pulses and synchronisation to only one edge of each pulse is required.

A further advantage of such a circuit is that, when embodied by MOS transistors, the degradation over time of the gate dielectric of individual devices due to hot electron and other effects, such as oxide charging, is reduced. The first stage of the circuit has a relatively low current consumption. The second stage has a higher current consumption, but the devices of this stage have substantially reduced on-time. The strain on any single device is therefore reduced.

Such a level shifting circuit provides a low power consumption arrangement for producing signals which are, for example, of direct use as control signals in an active matrix driver.

BRIEF DESCRIPTION OF THE DRAWINGS

The invention will be further described, by way of example, with reference to the accompanying drawings, in which.

Like reference numerals refer to like parts throughout the drawings.

DESCRIPTION OF THE PREFERRED EMBODIMENTS

Without loss of generality and by way of example only, the embodiments described hereinafter relate to level shifting circuits for increasing the logic high level of an input signal while leaving the common ground logic level of the signal substantially unchanged. For example, the input signal may be a digital logic signal which switches between zero volts ($V_{SS}$) and three volts ($V_{HH}$) and the output signal may be a digital logic signal switching between zero volts and 15 volts ($V_{DD}$).

Figure 8:
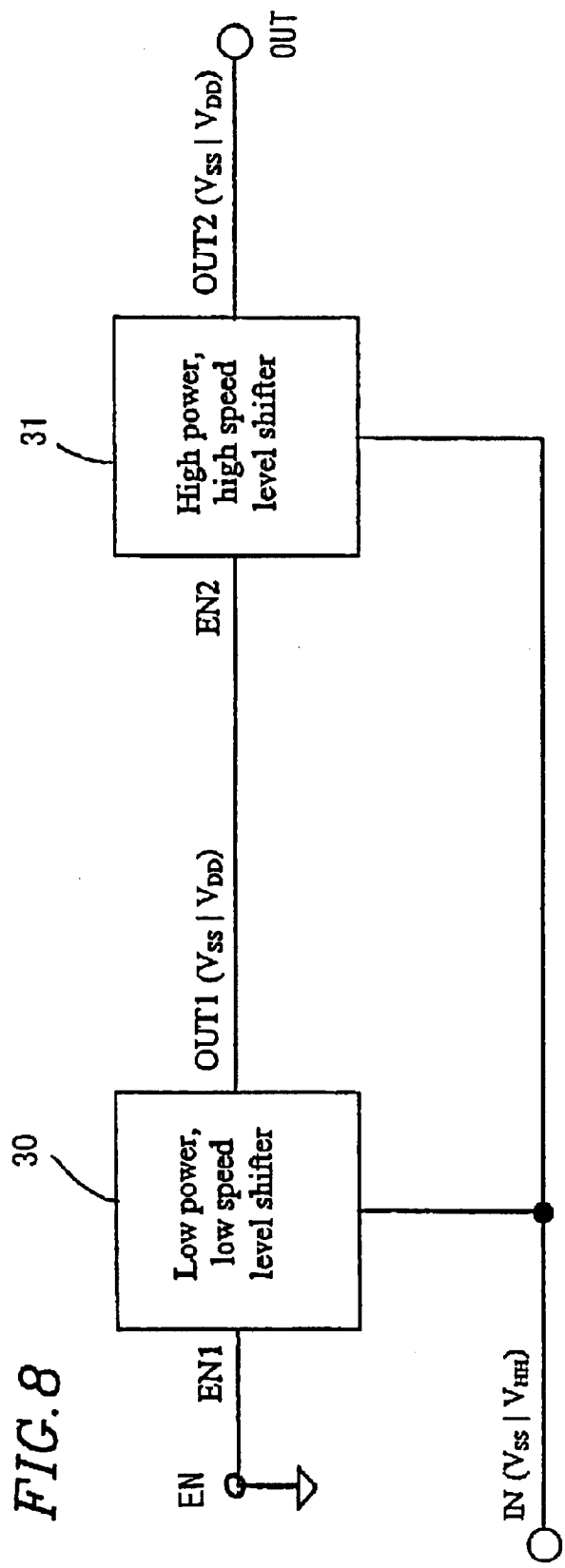
FIG. 8 is a block schematic diagram of a level shifting circuit constituting an embodiment of the invention.

The level shifting circuit shown in FIG. 8 comprises a first level shifting stage 30 and a second level shifting stage 31. The first stage 30 has an enable input EN1 connected to an enable input EN of the level shifting circuit. The enable input EN is shown as being connected to ground so that the first stage 30 is permanently enabled, but this is not essential. The first stage 30 has a first input connected to the signal input IN of the level shifting stage. The input IN receives a digital signal of relatively low voltage swing and the level shifting circuit is required to increase the upper logic level from $V_{HH}$ to $V_{DD}$.

The second stage 31 has a second enable input EN2 which is connected to the output OUT 1 of the first stage 30. The second stage 31 also has a signal input connected to the input IN. The output OUT 2 of the second stage 31 is connected to the output OUT of the level shifting circuit. The first stage 30 comprises a low speed low power level shifter. The second stage 31 comprises a high speed high power level shifter which is enabled or disabled according to the output of the first stage 30. The first stage 30 is shown as being permanently enabled so as to capture the first edge of input signal pulses.

Figure 9:
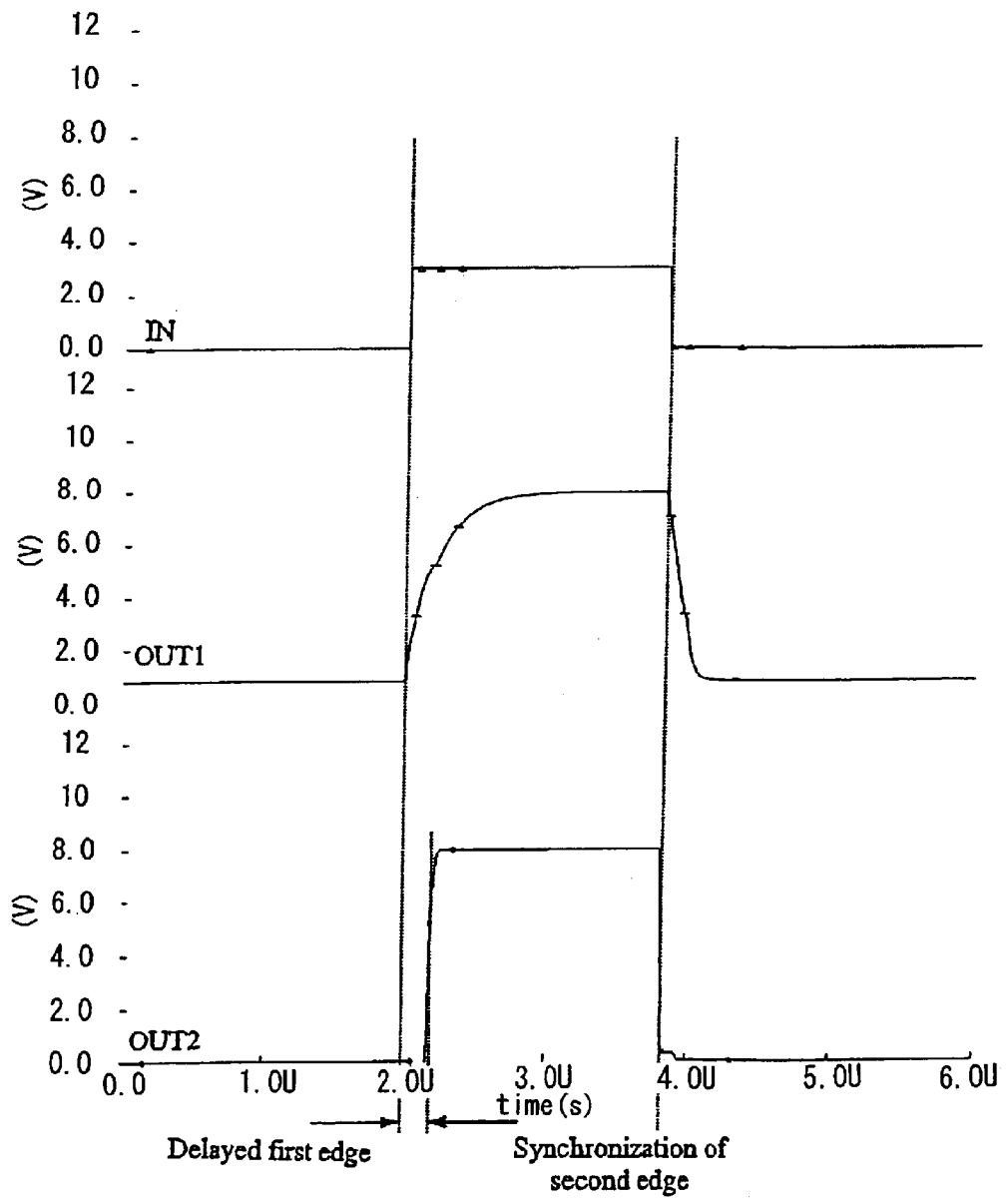
FIG. 9 is a waveform diagram illustrating operation of the circuit of FIG. 8.

FIG. 9 illustrates waveforms occurring during operation of the level shifting circuit for an "active high" input digital signal. Similar operation for an "an active low" input digital signal may be provided but will not be described in detail.

When the input signal at the input IN is at the logic low level, the output OUT 1 of the first stage 30, which is permanently enabled, is at the logic low level so that the second stage 31 is disabled. The second stage 31 operates at relatively high current so as to provide high speed operation but, when disabled, consumes a much lower current, such as zero current. The first stage 30 operates at a substantially lower current than the second stage 31 as it is not required to provide such high switching speeds.

When the leading edge of a pulse arrives at the input IN, the output of the first stage 30 rises towards the shifted upper logic level $V_{DD}$. When this output signal reaches the enable threshold of the second stage 31, the second stage 31 is enabled and its output OUT 2 switches relatively rapidly to the upper logic level $V_{DD}$. When the trailing edge of the pulse arrives, the output OUT 2 of the second stage 31 switches rapidly to the lower logic level. The output OUT 1 of the first stage 30 switches more slowly to the lower logic level so that the second stage 31 becomes disabled after it has passed the trailing edge of the pulse. The trailing edge of the output pulse is therefore substantially synchronised with the trailing edge of the input pulse. The second stage 31 then remains disabled until the arrival of the next pulse at the input IN.

The power consumption of the level shifting circuit is equal to the sum of the power consumption of the first stage 30 and the product of the power consumption of the second stage 31 and the mark: space ratio of the input signal. In a typical level shifting circuit embodied in low temperature poly-silicon technology, the power consumption of the first stage 30 is 100 lW, the power consumption of the second stage 31 when enabled is 2 mW and when disabled is substantially zero, and a typical mark: space ratio of an input signal is 0.05. The average power consumption of the level shifting circuit is therefore 200 lW. In order to achieve a similar speed of operation using conventional or known circuit arrangements, an equivalent circuit would be required to consume about 2 mW of power. Accordingly, power consumption can be reduced by about an order of magnitude while achieving the desired speed of operation.

Power savings can be achieved over a range of input signal mark:space ratios and the propagation delay of the trailing edge of each pulse can be made substantially as low as required for the specific application. For minimising propagation delay of the leading edge of an active high pulse, a level shifting circuit designed to operate on active low pulses may be used. Provided the (active high) mark: space ratio of the input signal is not too large, a saving in power consumption can still be achieved and the stress on the active devices is reduced.

Figure 10:
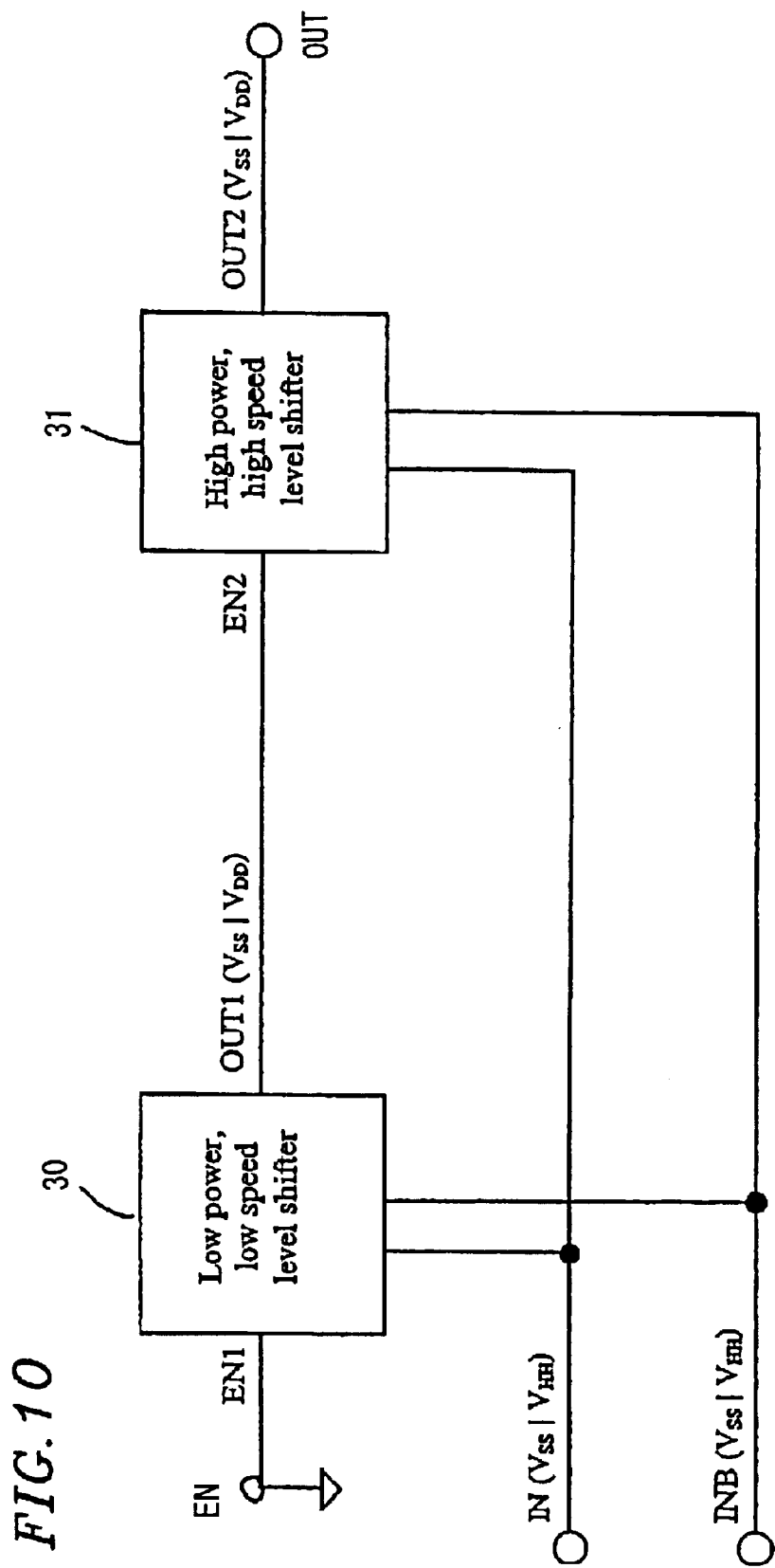
FIG. 10 is a block schematic diagram illustrating a level shifting circuit constituting a second embodiment of the invention.

The level shifting circuit shown in FIG. 10 differs from that shown in FIG. 8 only in that the circuit has complementary inputs IN and INB and each of the stages 30 and 31 has a complementary signal input. The operation is the same but the circuit of FIG. 10 is capable of providing a larger output voltage swing for a given level of input voltage swing. It is therefore possible to obtain robust operation with input signals of very low voltage swings, such as about one volt.

Figure 1:
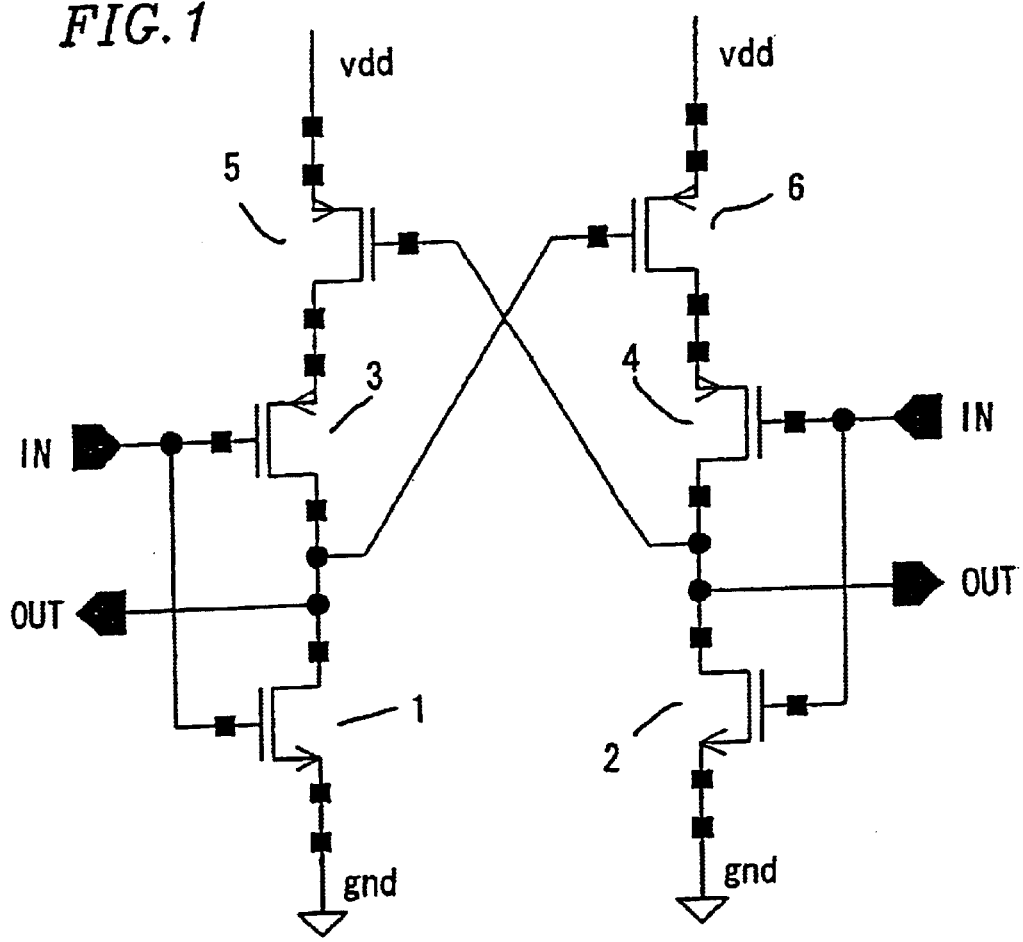
FIGS. 1 to 6 are circuit diagrams of known types of level shifting circuits.
Figure 2:
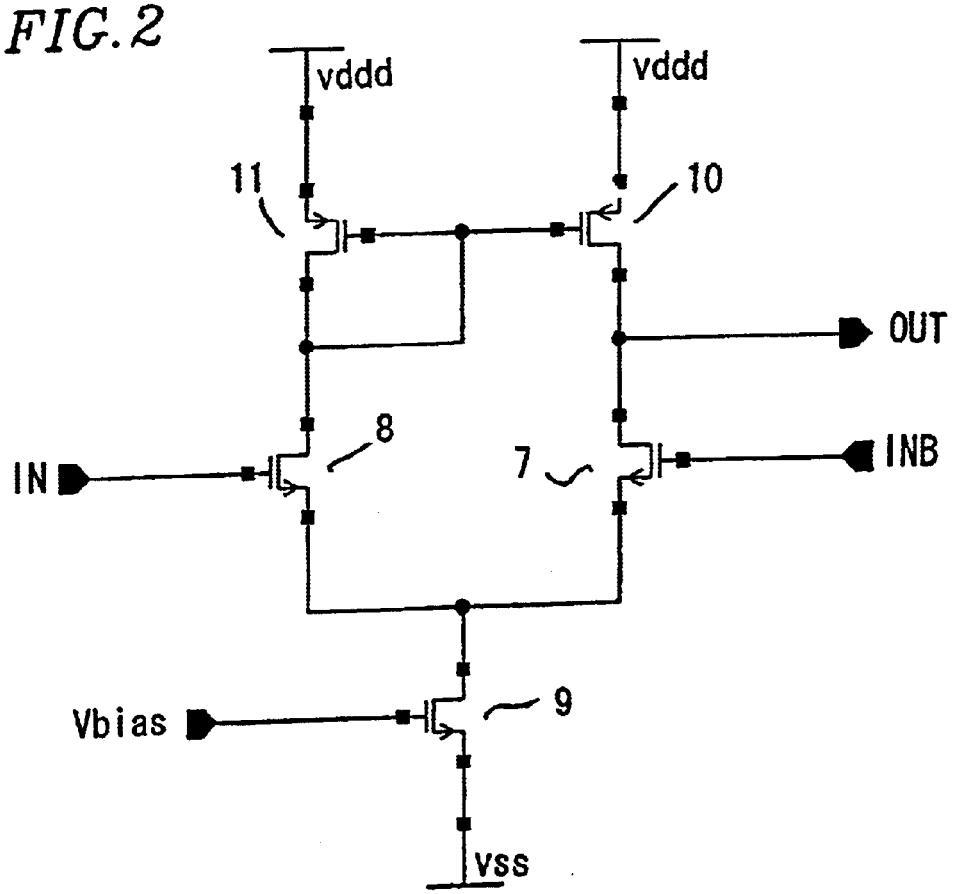
Figure 3:
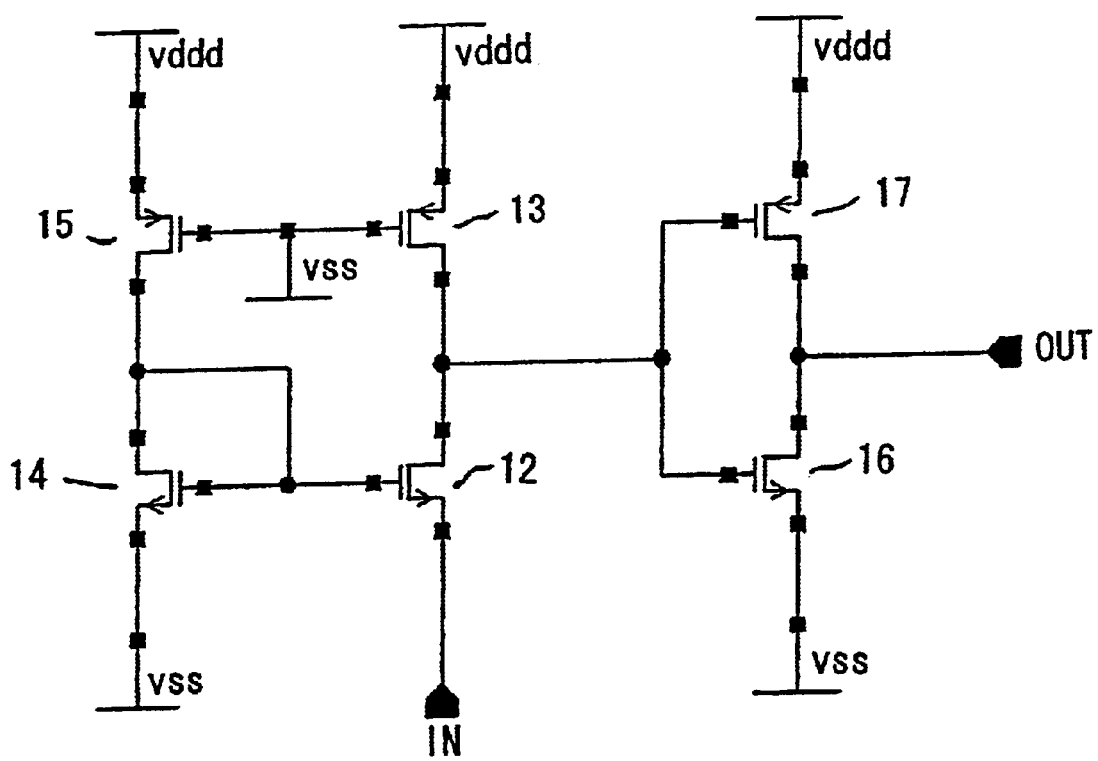
Figure 11:
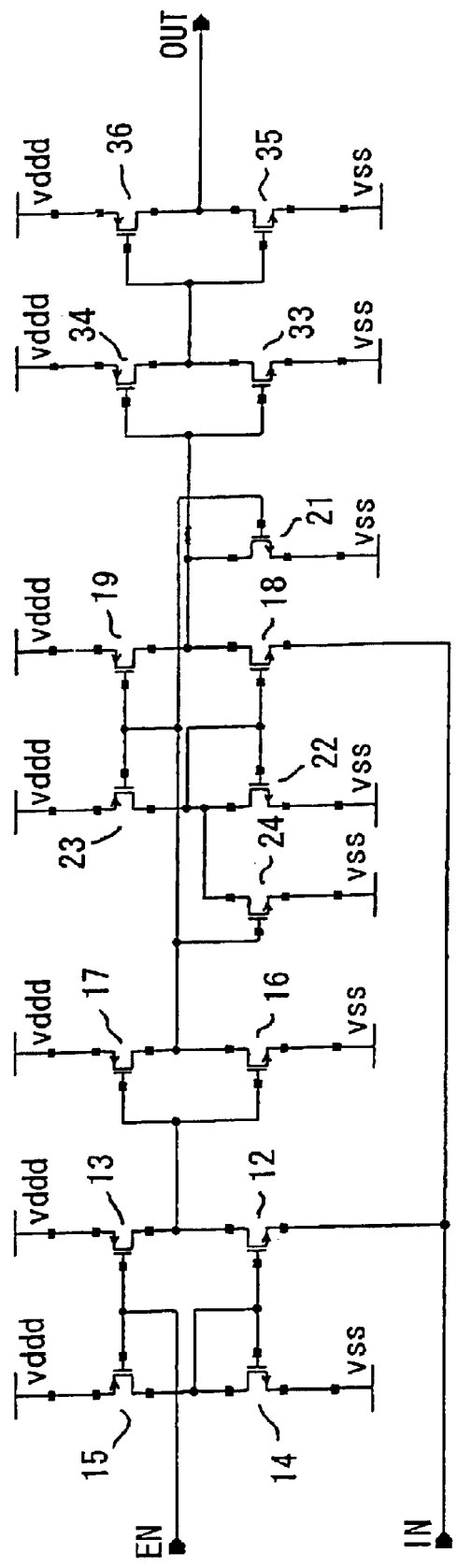
FIGS. 11 to 14 are circuit diagrams of circuits of the type illustrated in FIGS. 8 and 10.

FIG. 11 illustrates a specific example of circuit arrangement of the level shifting circuit shown in FIG. 8. The first stage 30 is of the type described hereinbefore and illustrated in FIG. 3, but modified such that the gates of the transistors 13 and 15 are connected to the enable input EN. When the enable signal is at the logic high level, the transistors 13 and 15 are switched off so as to disable the first stage. When the enable signal is at the logic low level, the transistors 13 and 15 are switched on and the first stage operates as described hereinbefore.

Figure 6:
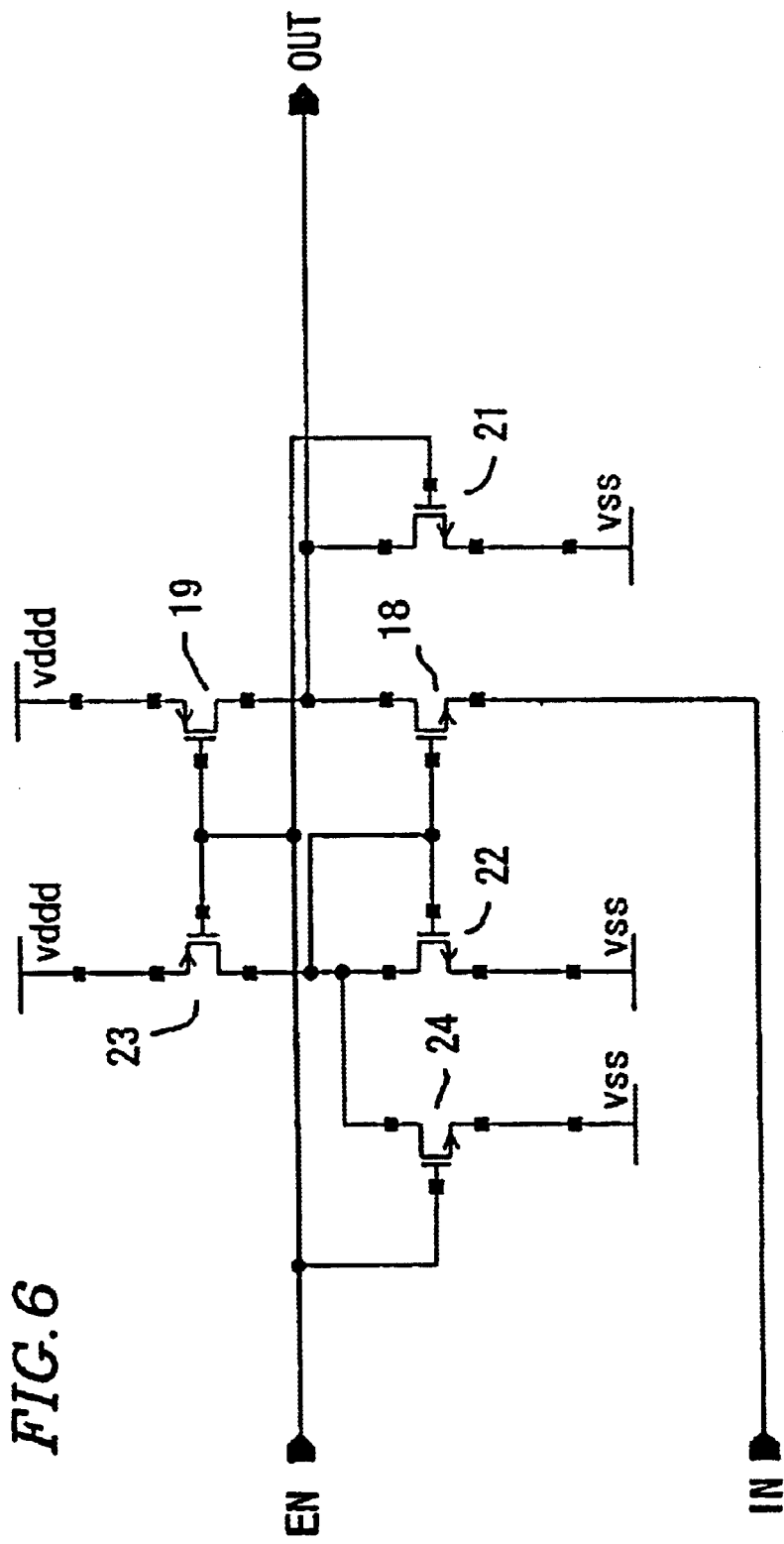

The second stage comprises a level shifter as described hereinbefore and as illustrated in FIG. 6. However, in order to ensure that the level-shifted output signal has upper and lower voltages substantially equal to the supply voltage and ground potential, the second stage also comprises series—connected complementary inverters comprising transistors 33, 34 and 35, 36.

Figure 12:
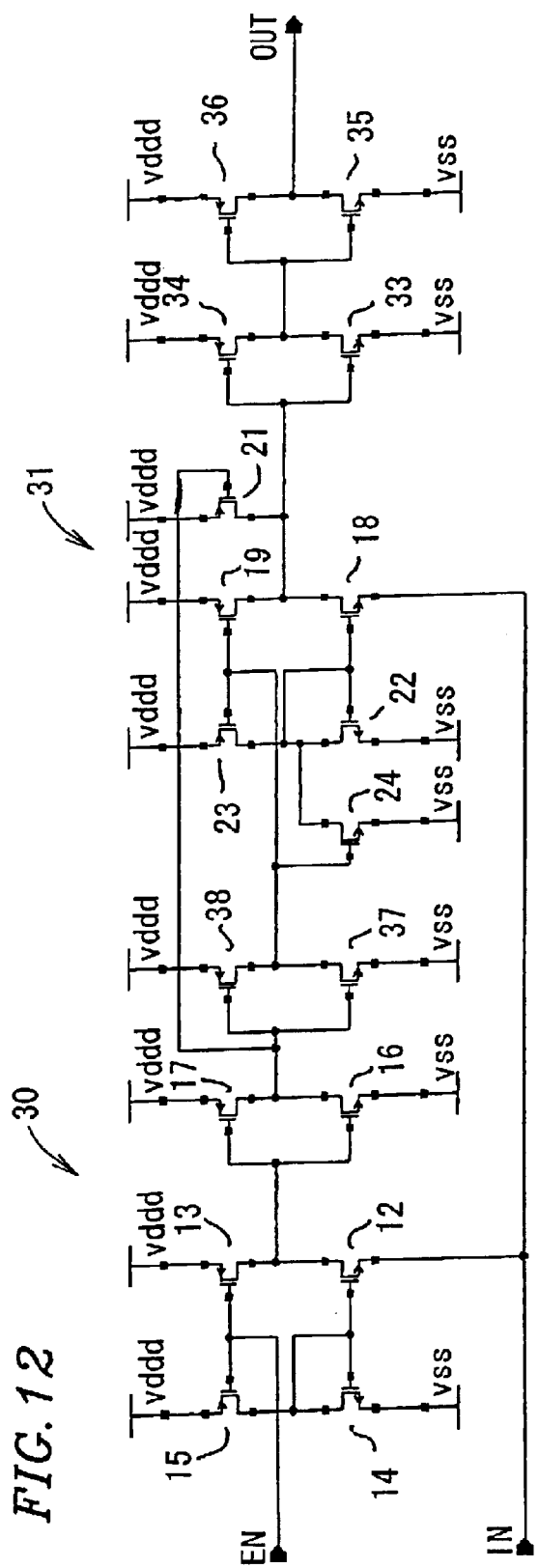

FIG. 12 illustrates in more detail another level shifting circuit which differs from that shown in FIG. 11 in that it operates with active low input signals. The first stage 30 differs from that shown in FIG. 11 in that a further inverter comprising transistors 37 and 38 is connected between the inverter comprising the transistors 16 and 17 and the enable input of the second stage 31. The output of the inverter comprising the transistors 16 and 17 is connected to the gate of the transistor 21, which in this embodiment comprises a p-channel, pull-up transistor.

Figure 4:
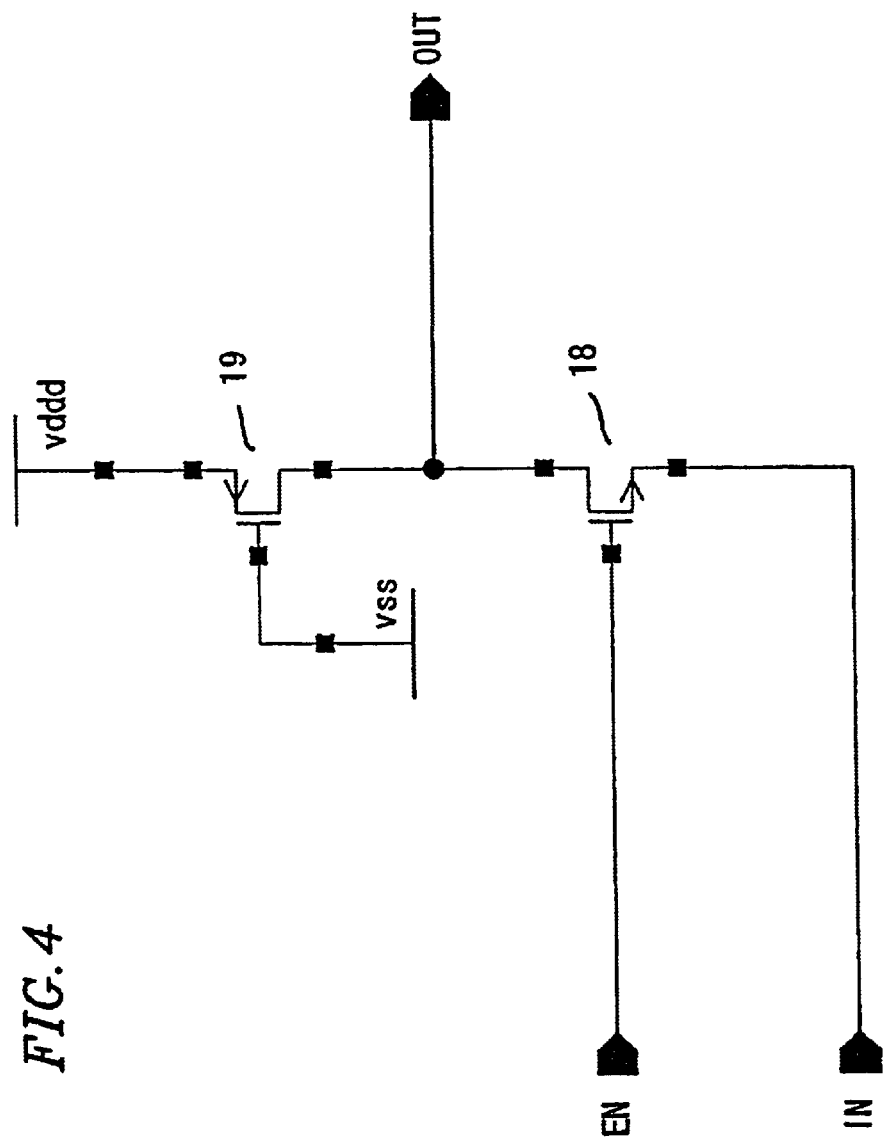
Figure 13:
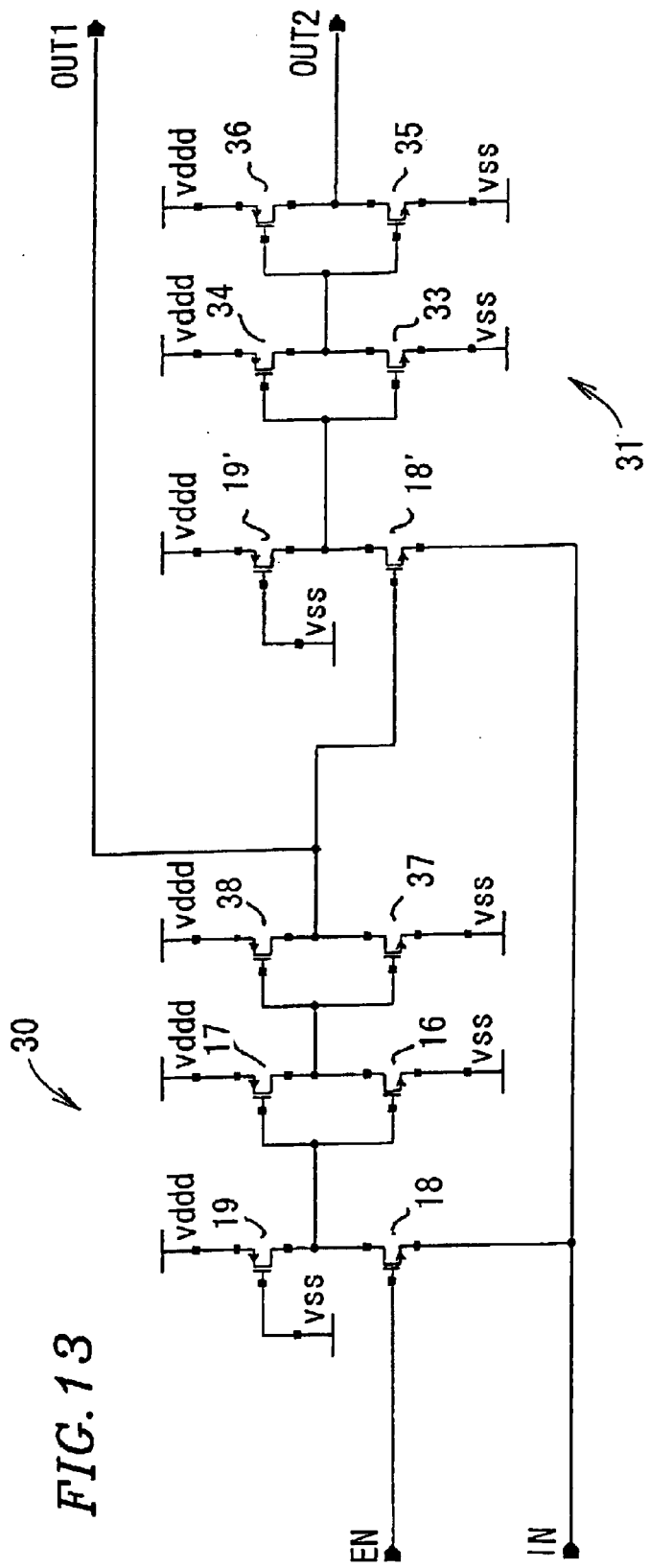

FIG. 13 illustrates another circuit for operation with active low input signals. This circuit differs from that shown in FIG. 12 in that the main level shifting sub-stage of each of the first and second stages 30 and 31 comprises a circuit of the type described hereinbefore and illustrated in FIG. 4. Thus, the first stage 30 comprises a level shifting sub-stage comprising the transistors 18 and 19 followed by two inverters as illustrated in FIG. 12. Similarly, the second stage 31 comprises a sub-stage comprising transistors 18' and 19' followed by two inverters as shown in FIG. 12. The outputs of the first and second stages are shown at OUT 1 and OUT 2.

Figure 14:
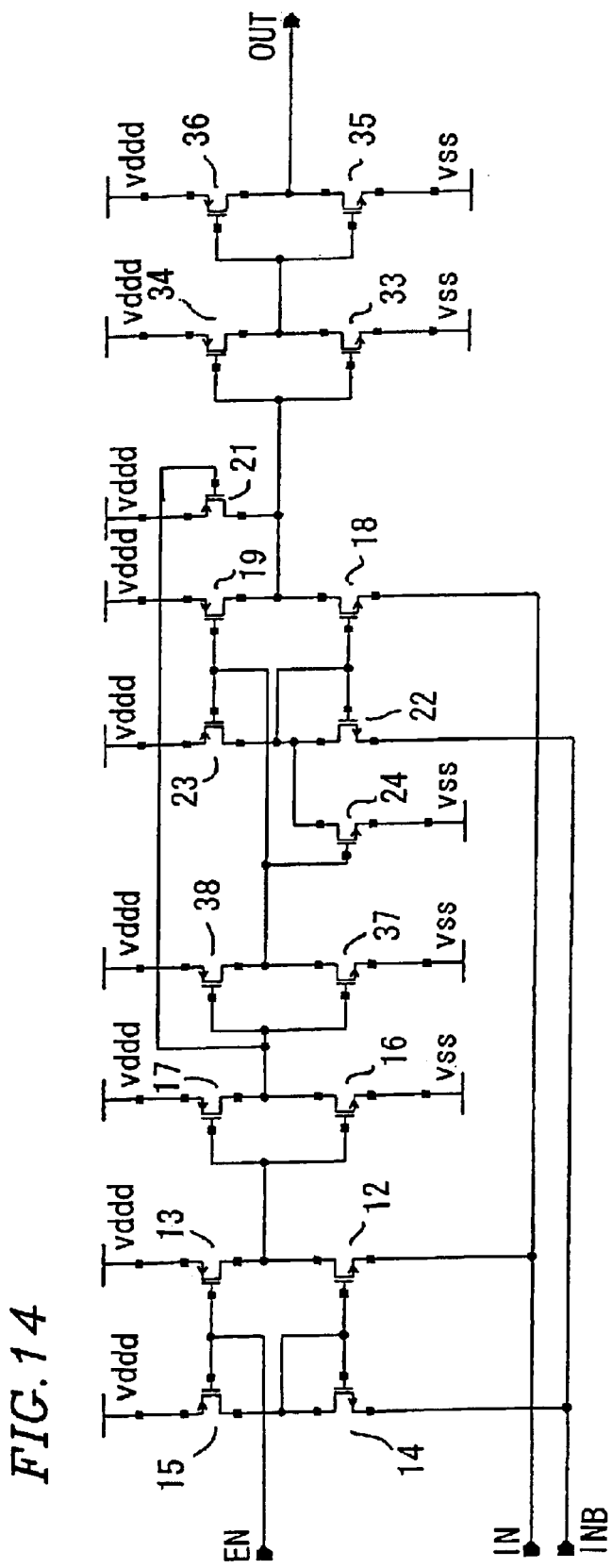

FIG. 14 shows a circuit which is also for operation with active low input signals and which differs from that shown in FIG. 12 in that it is arranged to receive complementary input signals at inputs IN and INB. The sources of the transistors 14 and 22 are connected to the complementary input INB.

Figure 15:
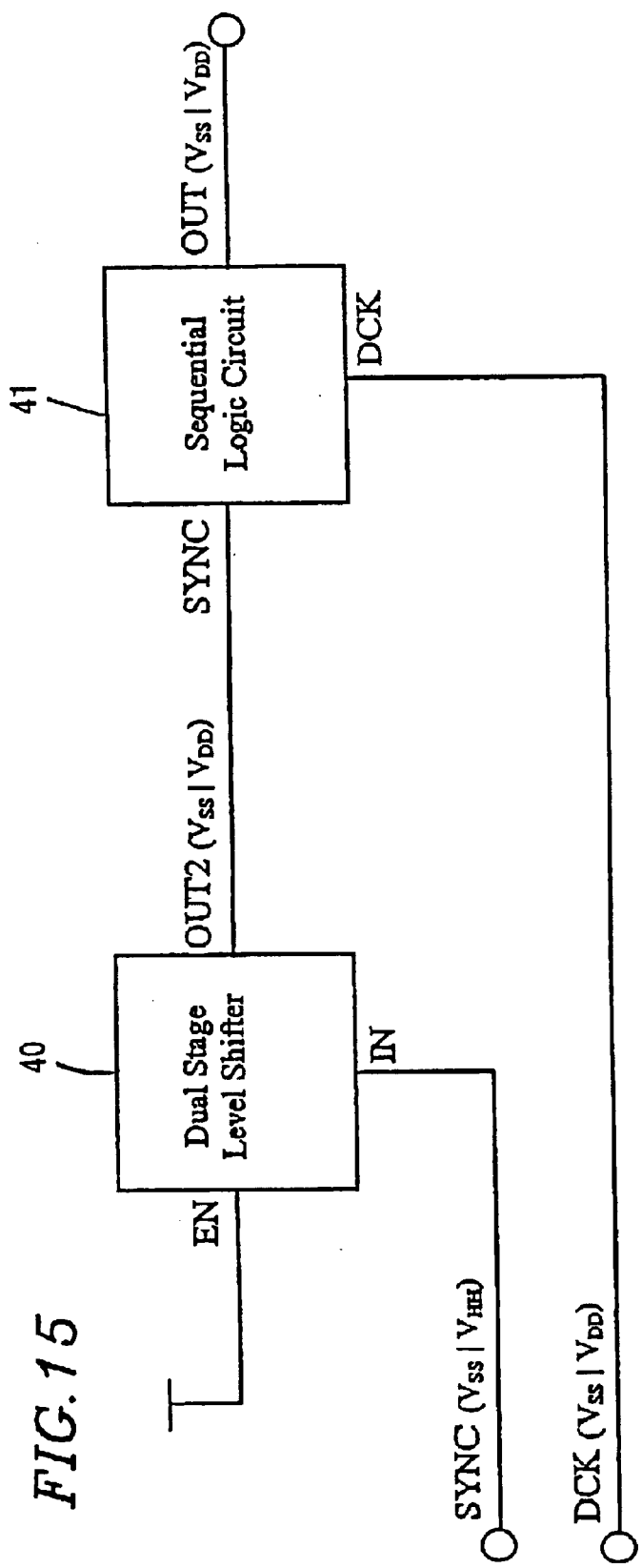
FIG. 15 is a block schematic diagram of a circuit constituting a third embodiment of the invention.

FIG. 15 illustrates a circuit arrangement for performing level shifting in order to generate control signals, for example for use in an active matrix driver. The circuit arrangement comprises a dual stage level shifter 40, for example of any of the types illustrated in FIGS. 8 and 10 to 14, whose signal input IN is arranged to receive synchronisation signals SYNC which switch between a lower logic level $V_{SS}$ and a higher logic level $V_{HH}$. The dual stage level shifter 40 supplies level—shifted signals at its output OUT 2 which switch between $V_{SS}$ and $V_{DD}$. These signals are supplied to the synchronisation input of a sequential logic circuit 41 which has a clock input for receiving clock signals DCK which switch between $V_{SS}$ and $V_{DD}$. The circuit 41 provides an output which also switches between $V_{SS}$ and $V_{DD}$.

Figure 16:
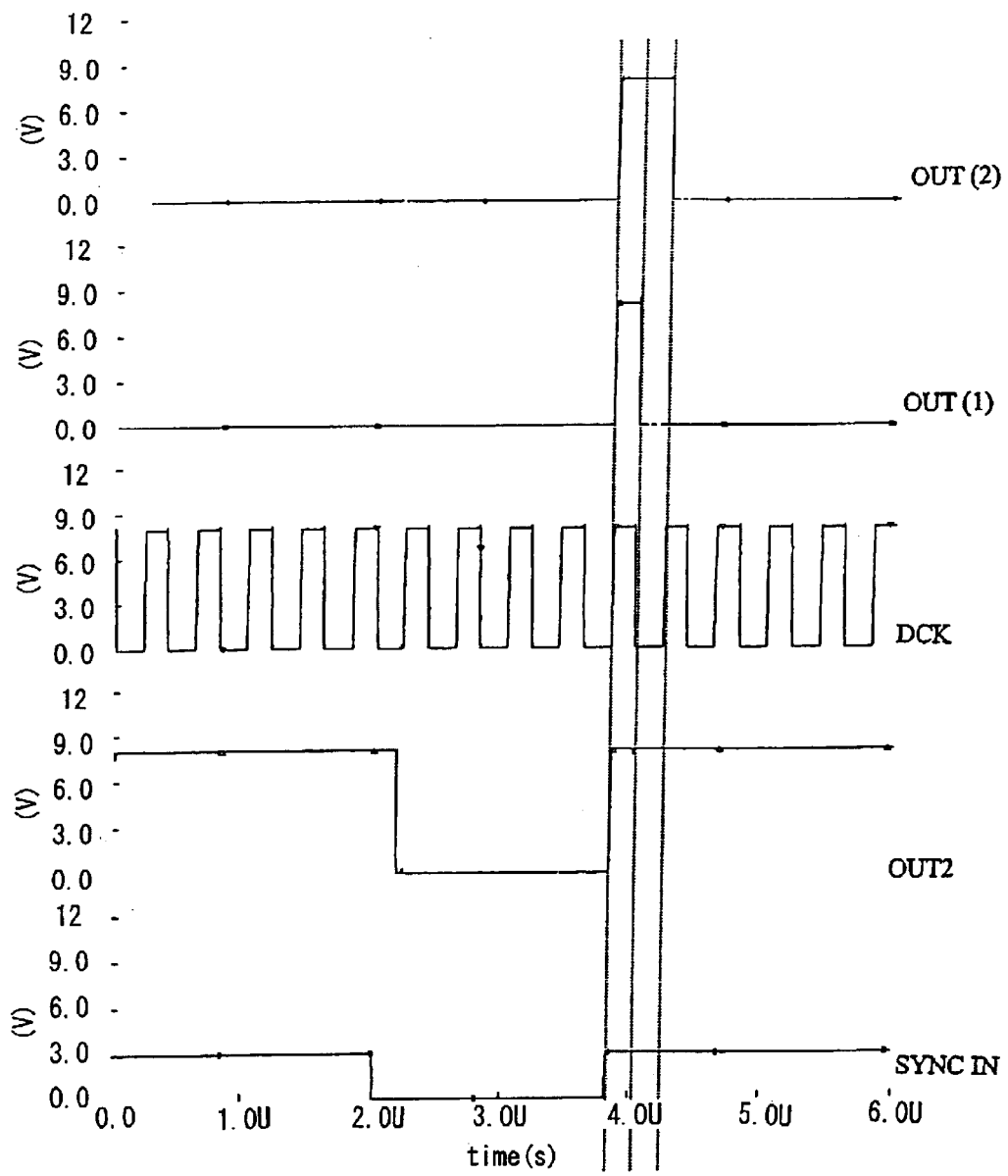
FIG. 16 is a waveform diagram illustrating operation of the circuit of FIG. 15.

The waveforms shown in FIG. 16 illustrate the operation of the circuit arrangement shown in FIG. 15. Two types of output pulses from the circuit 41 are illustrated at OUT (1) and OUT (2). In both cases, the rising edge of the output pulse is synchronised to the rising edge of both the clock signal DCK and the synchronisation signal SYNC IN. An output pulse with a width of one clock pulse width is shown at OUT (1) and with one clock period at OUT (2). Such output pulses may be used directly as control signals in active matrix drivers.

Figure 5:
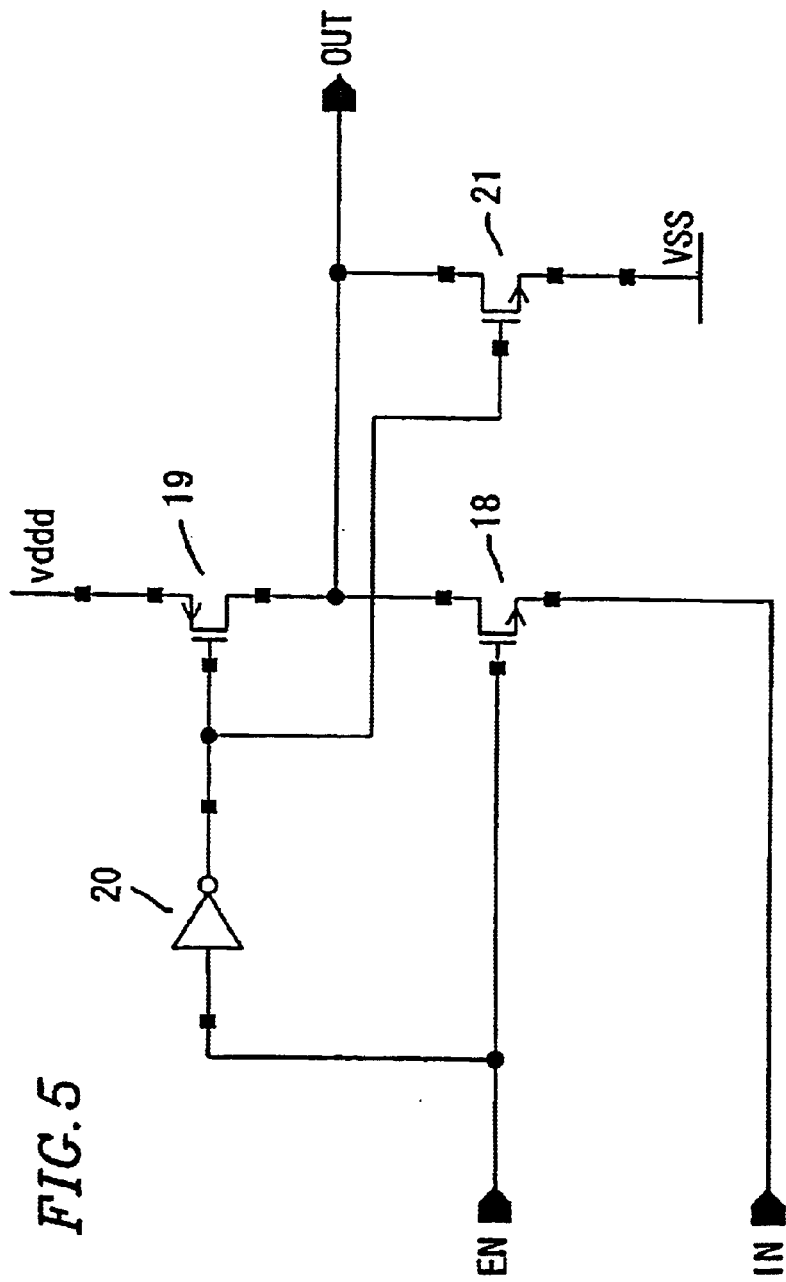
Figure 17:
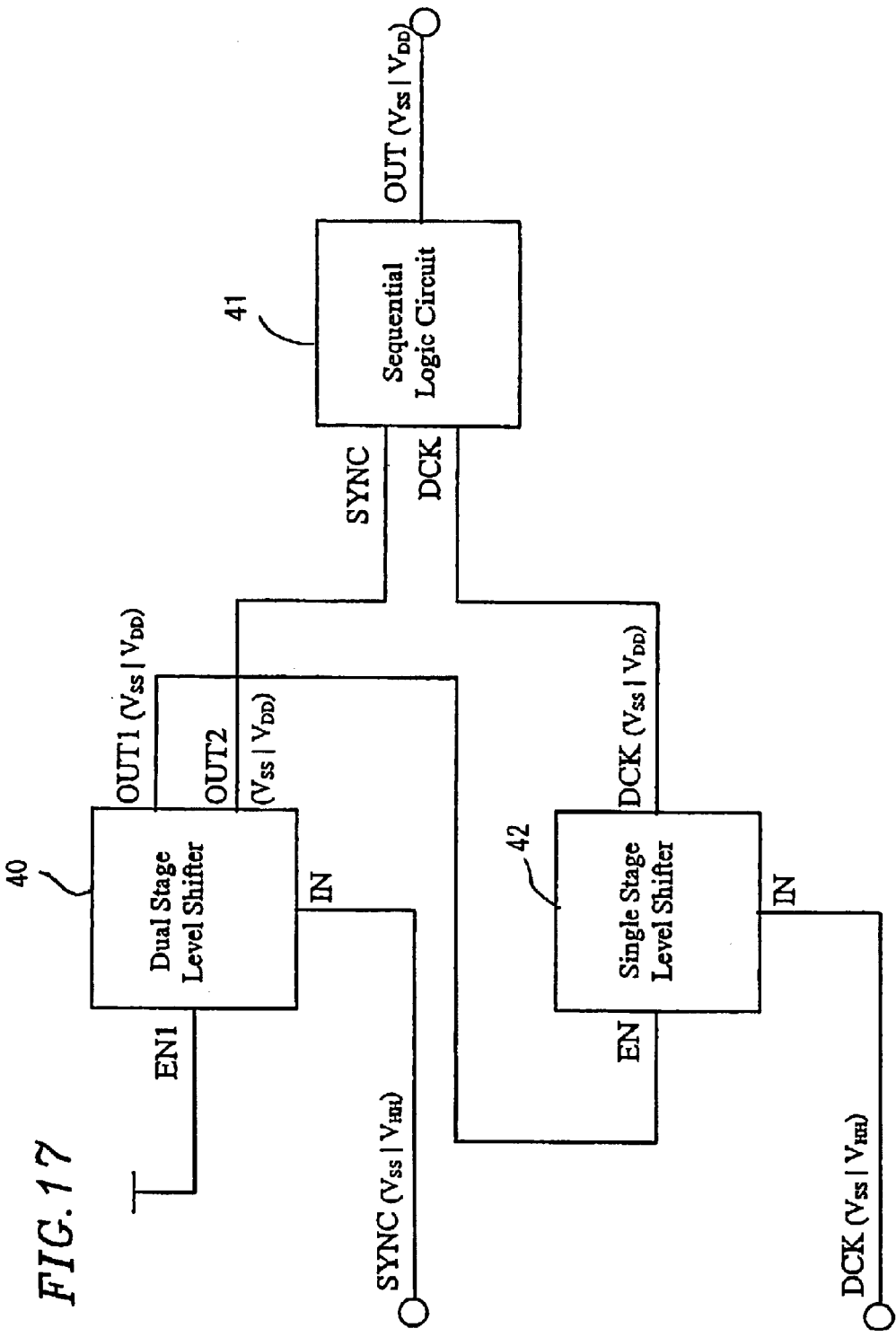
FIG. 17 is a block schematic diagram of a circuit constituting a fourth embodiment of the invention.

FIG. 17 illustrates a circuit arrangement which differs from that shown in FIG. 15 in that a single stage level shifter 42 is provided for level-shifting the clock signal DCK, such that the upper level is shifted from $V_{HH}$ to $V_{DD}$. The level shifter 42 has an enable input connected to the output OUT 1 of the first stage of the dual stage level shifter 40. The single stage level shifter 42 may, for example, be of the type described hereinbefore and shown in any one of FIGS. 4 to 6. Thus, the single stage level shifter 42 is of high speed type and is enabled synchronously with the second stage of the dual stage level shifter 40.

Figure 18:
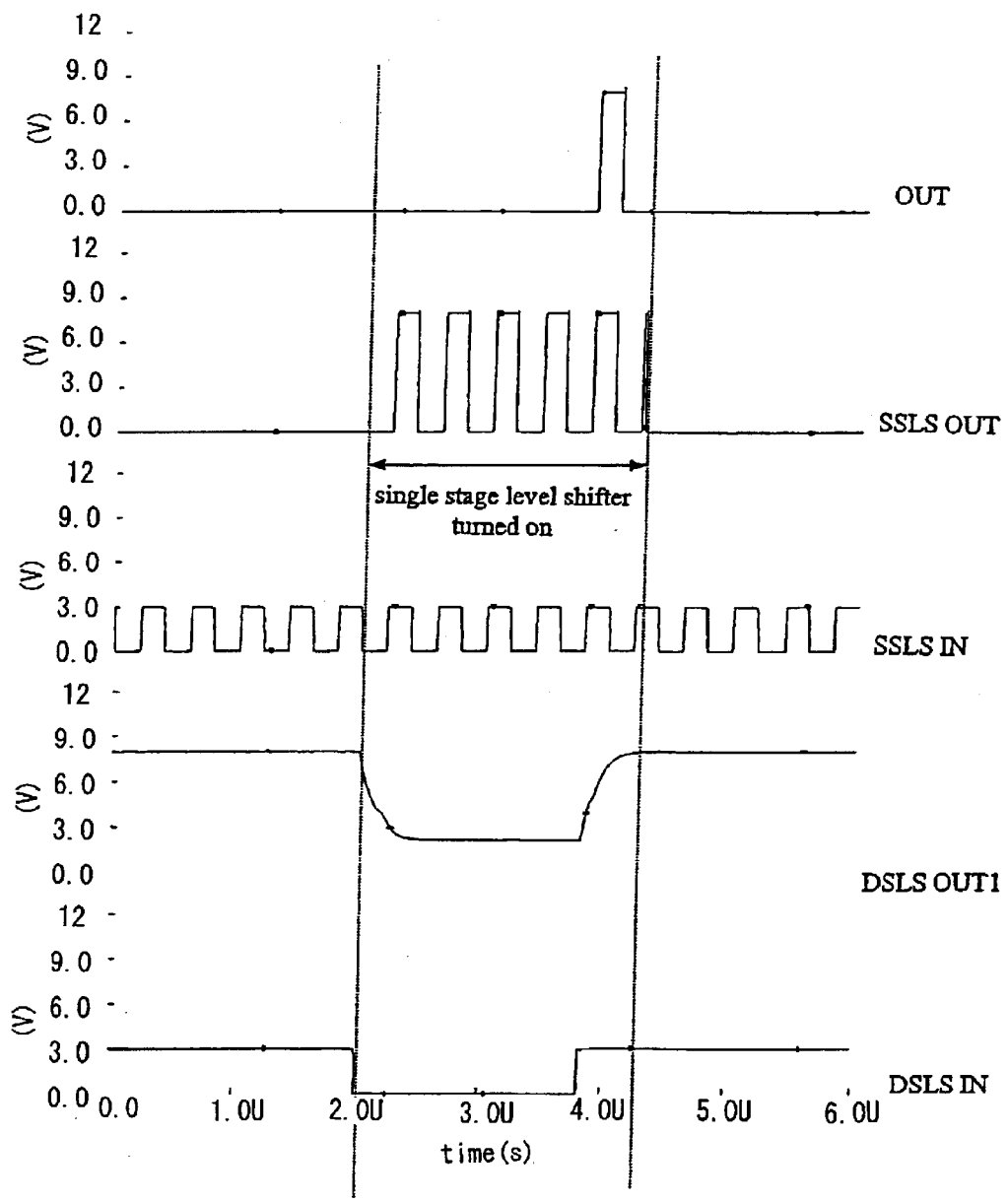
FIG. 18 is a waveform diagram illustrating operation of the circuit of FIG. 17.

The operation of the circuit arrangement of FIG. 17 is illustrated by the waveform diagram of FIG. 18. The dual stage level shifter 40 operates as described hereinbefore with an active low synchronisation signal shown in FIG. 18 as DSLS IN. The enable signal produced by the first stage of the dual stage level shifter 40 is illustrated as DSLS OUT1. The clock pulses supplied to the input of the single stage level shifter are illustrated at SSLS IN and the output of this stage is shown at SSLS OUT. The output of the circuit arrangement at the output of the sequential logic circuit 41 is illustrated at OUT.

The relatively high power single stage level shifter 42 required for high speed operation is thus only enabled when required. The circuit arrangement of FIG. 17 thus has a lower power consumption than the circuit arrangement of FIG. 15.

Figure 19:
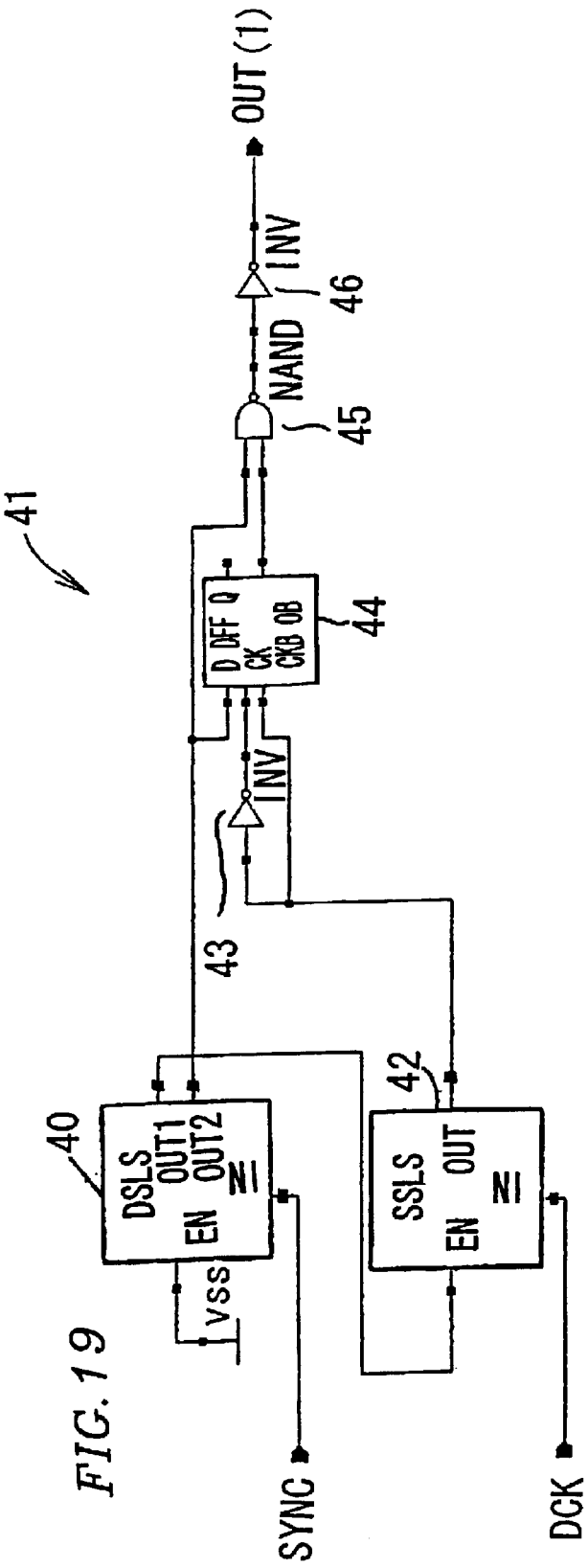
FIGS. 19 to 21 are circuit diagrams of circuits of the type shown in FIG. 17.

A specific form of the sequential logic circuit 41 of the embodiment shown in FIG. 17 is illustrated in more detail in FIG. 19. The output of the single stage level shifter 42 is connected to a complementary clock input CKB and, via an inverter 43, to a direct clock input CK of a D-type latch 44. The complementary output QB of the latch 44 is connected to the first input of a NAND gate 45, whose second input is connected to the output OUT 2 of the dual stage level shifter 40 and to the data input of the latch 44. The output of the gate 45 is connected to the input of an inverter 46, which supplies output signals OUT (1) having a pulse width equal to the clock pulse width.

Figure 20:
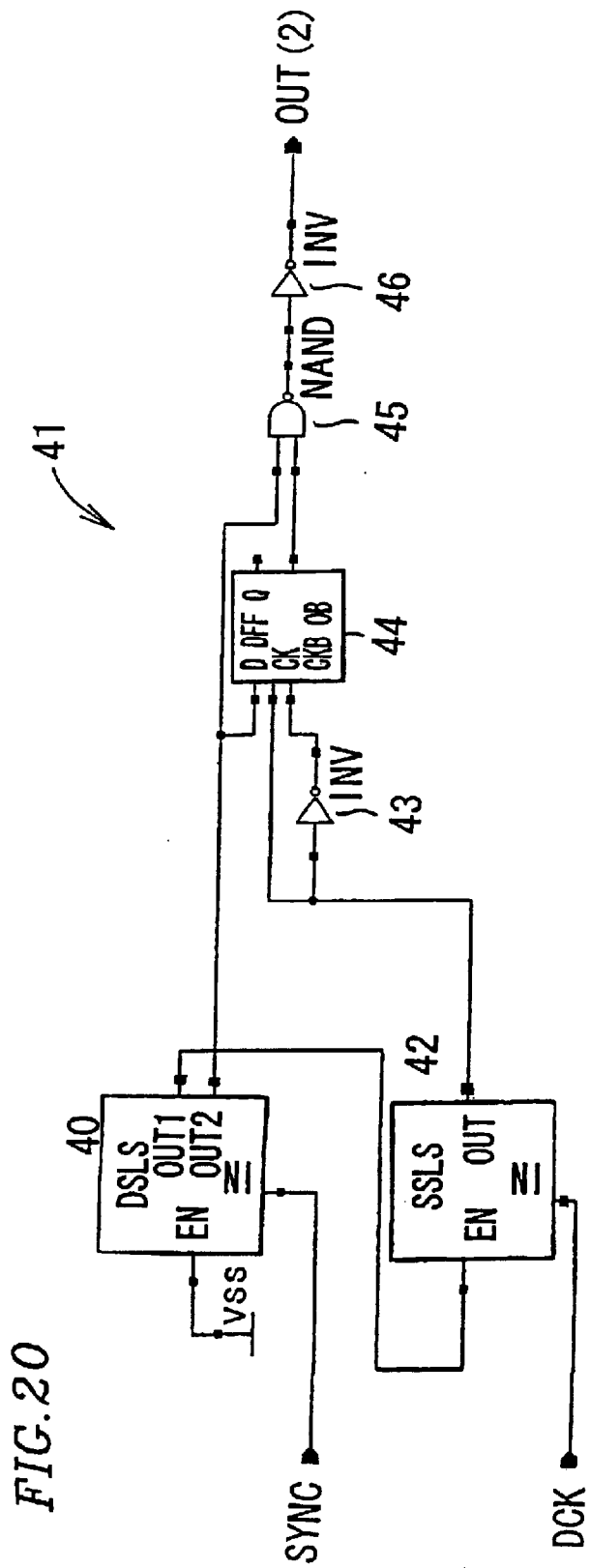

FIG. 20 shows a modified form of the sequential logic circuit 41 shown in FIG. 19 to provide output signals OUT (2) having a pulse width equal to the period of the clock signals DCK. In this case, the output of the single stage level shifter 42 is supplied to the direct clock input CK of the latch 44 and is inverted by the inverter 43 and supplied to the complementary clock input CKB.

Figure 21:
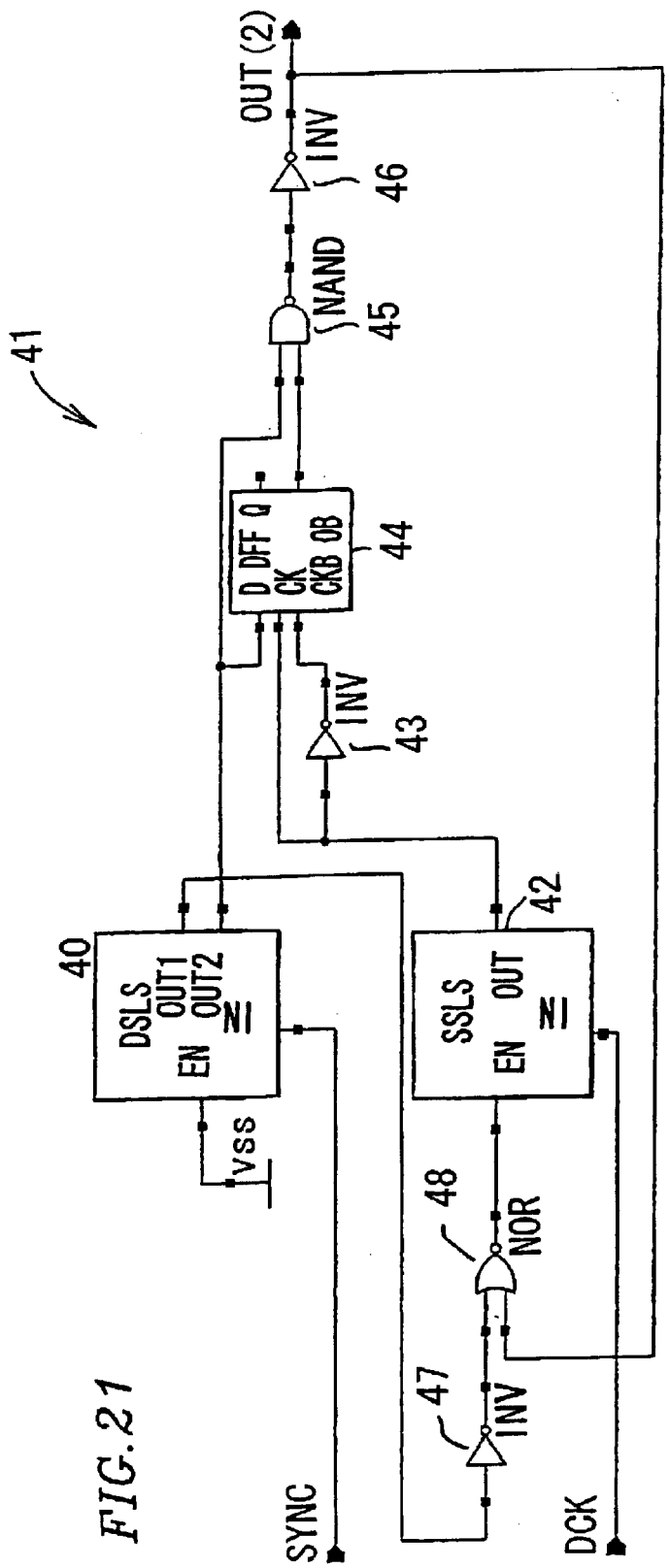

FIG. 21 illustrates a circuit arrangement which differs from that shown in FIG. 20 in order to provide protection against the effect of process variations. In particular, if, because of process variations, the first stage operates faster than expected, the single stage level shifter 42 may not be active for long enough to produce the correct output pulse from the sequential logic circuit 41. In order to overcome this problem, the output of the first stage of the dual stage level shifter 40 is connected via an inverter 47 to the first input of a NOR gate 48, whose second input is connected to the output of the inverter 46 and whose output is connected to the enable input of the single stage level shifter 42. This arrangement latches the single stage level shifter 42 so as to hold it enabled until the output pulse at the output of the inverter 46 has made its second transition. The circuit arrangement is therefore less susceptible to incorrect operation resulting from process variations.

Figure 7:
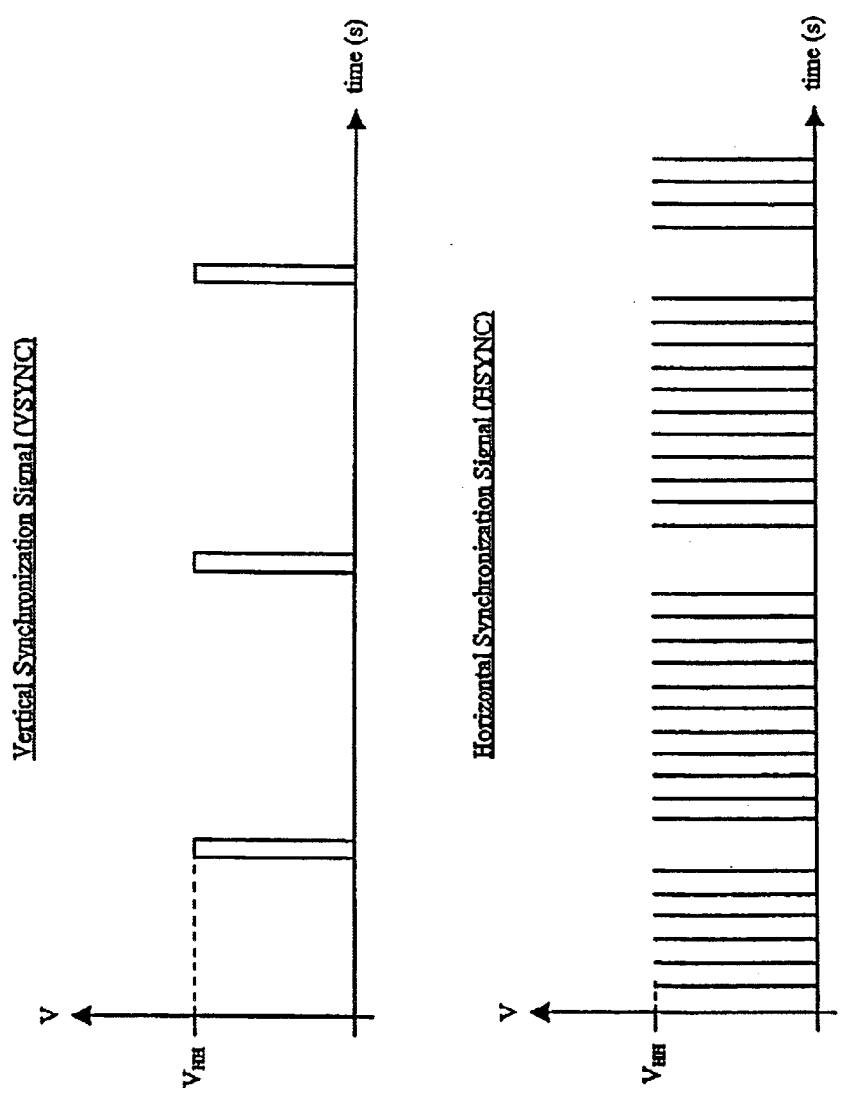
FIG. 7 is a waveform diagram illustrating known types of vertical and horizontal synchronisation signals for active matrix drivers, for example of flat panel displays.
Figure 22:
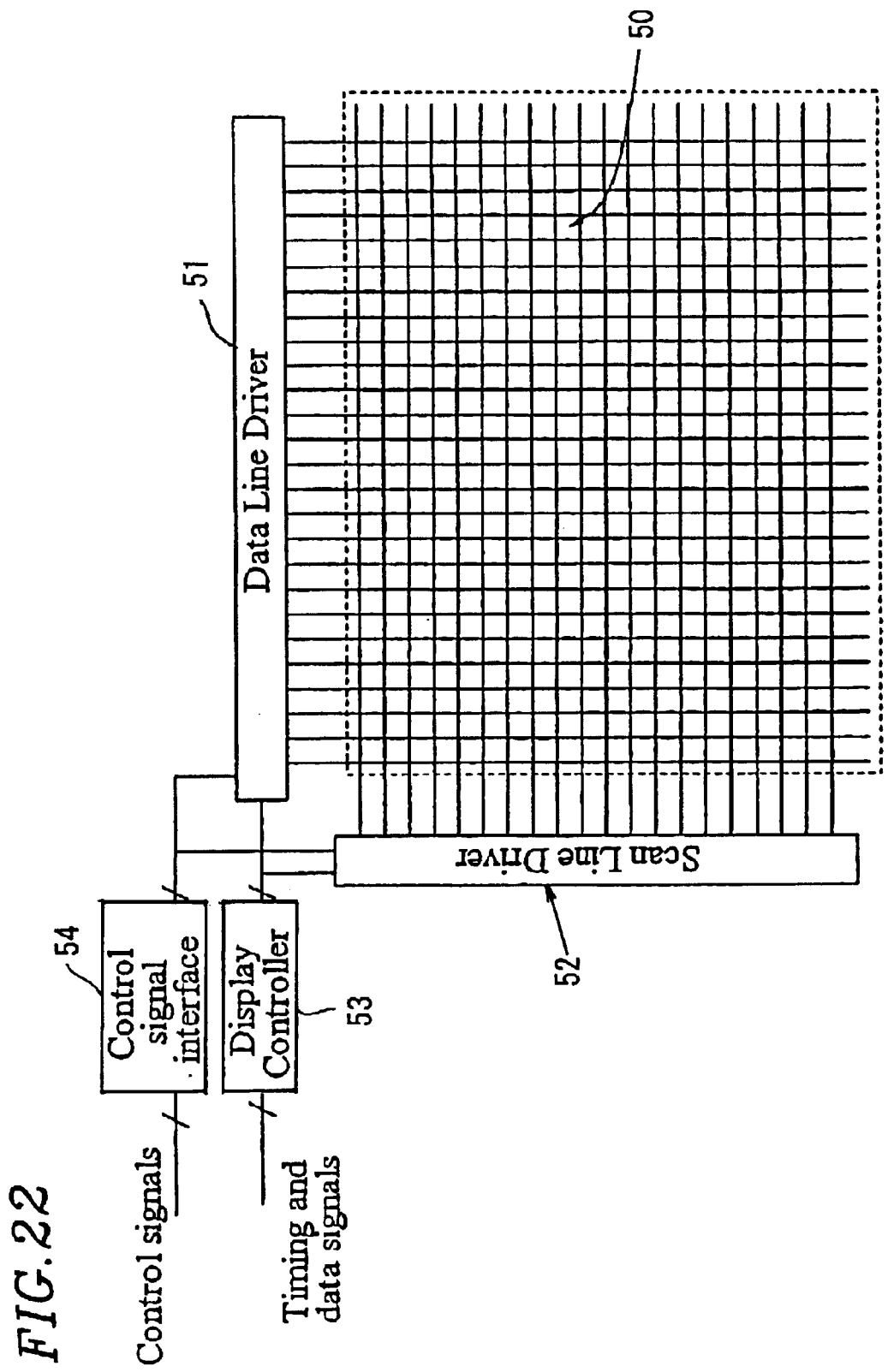
FIG. 22 is a block schematic diagram of an active matrix display and active matrix driver including a level shifting circuit constituting an embodiment of the invention.

FIG. 22 illustrates schematically an active matrix liquid crystal display of the flat panel type and comprising an active matrix 50 controlling liquid crystal picture elements (not shown) and an active matrix driver. The driver comprises a data line driver 51, a scan line driver 52, a display controller 53 and a control signal interface 54. The display controller 53 operates at the higher voltage swing and receives timing and data signals which do not require level-shifting. The control signal interface 54 receives control signals of the lower voltage swing which hence do require level-shifting. The control signal interface 54 thus contains one or more level shifting circuits or circuit arrangements as illustrated in any of FIGS. 8 to 21. Thus, incoming low voltage level control signals, such as vertical and horizontal synchronisation signals as illustrated in FIG. 7, are level-shifted and used in the display controller 53 and the line drivers 51 and 52 to control operation of the display.

The present invention, described above, provides a level shifting circuit which is capable of operation at high speed and is of relatively low power consumption as compared with the above-described conventional art, and an active matrix driver using the same.

What is claimed is:

1. A level shifting circuit comprising: a first level shifting stage having a first enable input, a first signal input for receiving an input signal having a first voltage swing, a first output for providing a first output signal having a second voltage swing greater than the first voltage swing, a first power consumption when enabled, and a first switching speed; and a second level switching stage having a second enable input connected to the first output, a second signal input for receiving the input signal, a second output for providing a second output signal having a third voltage swing greater than the first voltage swing, a second power consumption when enabled and a third power consumption when disabled with the second power consumption being greater than each of the first and third power consumptions, and a second switching speed which is faster than the first switching speed.

2. A circuit as claimed in claim 1, in which the input signal swings between first and second voltage levels and the first and second stages are arranged to shift only the second voltage level.

3. A circuit as claimed in claim 2, in which the first voltage level is ground potential.

4. A circuit as claimed in claim 1, in which the third power consumption is substantially equal to zero.

5. A circuit as claimed in claim 1, in which the second stage comprises setting means for setting the second output to a predetermined state when the second stage is disabled.

6. A circuit as claimed in claim 5, in which the setting means comprises a pull-up or pull-down transistor whose control electrode is connected to the second enable input.

7. A circuit as claimed in claim 6, in which the or each transistor is a metal oxide semiconductor (MOS) transistor.

8. A circuit as claimed in claim 1, in which the first enable input is connected for permanently enabling the first stage.

9. A circuit as claimed in claim 1, in which the first and second signal inputs are differential inputs.

10. A circuit as claimed in claim 1, comprising a sequential logic circuit having a synchronisation input connected to the second output and a clock input for receiving a clock signal.

11. A circuit as claimed in claim 10, in which the logic circuit is arranged to produce output pulses synchronised to the second output signal and to the clock signal.

12. A circuit as claimed in claim 11, in which each output pulse has a pulse width substantially equal to the pulse width or period of the clock signal.

13. A circuit as claimed in claim 10, in which the logic circuit comprises a D-type latch having a data input connected to the second output and a clock input connected to receive the clock signals.

14. A circuit as claimed in claim 13, in which the logic circuit comprises an AND gate having a first input connected to the second output and a second input connected to an inverting output of the latch.

15. A circuit as claimed in claim 10, comprising a third level shifting stage having a third output connected to the clock input of the logic circuit, a third signal input for receiving the clock signal, and a third enable input responsive to the second output signal.

16. A circuit as claimed in claim 15, in which the third enable input is connected to the second output.

17. A circuit as claimed in claim 15, in which the third enable input is arranged to receive the result of ANDing the second output signal with the complement of the output signal of the logic circuit.

18. A circuit as claimed in claim 1, in which each of the first and second stages and the third stage when present comprises a sub-stage comprising a first transistor of a first conductivity type whose common terminal is connected to the signal input of the stage and whose output terminal is connected to the output terminal of a second transistor of a second conductivity type opposite the first type, whose common terminal is connected to a first power supply line.

19. A circuit as claimed in claim 18, in which the output terminal of the first transistor is connected via at least one inventor to the output of the stage.

20. A circuit as claimed in claim 18, in which the control terminal of the first transistor is connected to the enable input of the stage.

21. A circuit as claimed in claim 18, in which the control terminal of the second transistor is connected to a second power supply line.

22. A circuit as claimed in claim 18, in which the sub-stage comprises a third transistor of the first conductivity type, whose control and output terminals are connected to the control terminal of the first transistor, and a fourth transistor of the second conductivity type, whose common terminal is connected to the first power supply line, whose output terminal is connected to the output terminal of the third transistor, and whose control terminal is connected to the control terminal of the second transistor and to the enable input of the stage.

23. A circuit as claimed in claim 22, in which the common terminal of the third transistor is connected to a second power supply line.

24. A circuit as claimed in claim 22 when dependent on claim 9, in which the common terminal of the third transistor is connected to a complementary signal input of the stage.

25. A circuit as claimed in claim 22, in which the sub-stage of each of the second stage and, when present, the third stage comprises a pull-down transistor connected between the output terminal of the third transistor and a or the second power supply line with a control terminal connected to the second or third enable input.

26. A circuit as claimed in claim 18, in which the or each transistor is a metal oxide semiconductor (MOS) transistor.

27. A circuit as claimed in claim 26, in which the or each transistor is a poly-silicon thin film transistor.

28. An active matrix driver comprising a circuit as claimed in claim 1.

* * * * *